US006550033B1

United States Patent
Dwork

(10) Patent No.: US 6,550,033 B1
(45) Date of Patent: Apr. 15, 2003

(54) METHOD AND APPARATUS FOR EXERCISING EXTERNAL MEMORY WITH A MEMORY BUILT-IN TEST

(75) Inventor: Jeffrey Dwork, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/504,907

(22) Filed: Feb. 16, 2000

Related U.S. Application Data

(60) Provisional application No. 60/171,491, filed on Dec. 22, 1999.

(51) Int. Cl.[7] ............................................. G01R 31/28
(52) U.S. Cl. ..................................... 714/733; 714/30
(58) Field of Search .................................. 714/30, 733

(56) References Cited

U.S. PATENT DOCUMENTS

| | | | |
|---|---|---|---|
| 4,974,236 A | 11/1990 | Gurcan et al. | 375/301 |
| 5,508,752 A | 4/1996 | Kim et al. | 348/608 |
| 5,512,957 A | 4/1996 | Hulyalkar | 348/607 |
| 5,801,595 A | 9/1998 | Davis et al. | 332/170 |
| 5,949,878 A | 9/1999 | Burdge et al. | 380/276 |
| 5,974,579 A * | 10/1999 | Lepejian et al. | 714/733 |
| 6,044,481 A * | 3/2000 | Kornachuk et al. | 714/724 |
| 6,151,692 A * | 11/2000 | Smitlener et al. | 714/718 |
| 6,237,123 B1 * | 5/2001 | Kim et al. | 714/733 |

OTHER PUBLICATIONS

Nadeau–Dostie et al., Serial interfaceing for embedded–memory testing, IEEE, p. 52–63, 1990.*
International Search Report for PCT/US00/04080, filed Feb. 17, 2000.

* cited by examiner

*Primary Examiner*—Albert Decady
*Assistant Examiner*—Shelly A Chase

(57) ABSTRACT

A network interface controller with an external memory is provided with memory built-in self-test (MBIST) logic that exercises the memory subsystem. The memory testing is run at normal operating speed to test normal and worst-case access patterns. By adjusting a memory size register and running the MBIST test with different sizes, the actual size of the memory is determined.

7 Claims, 4 Drawing Sheets

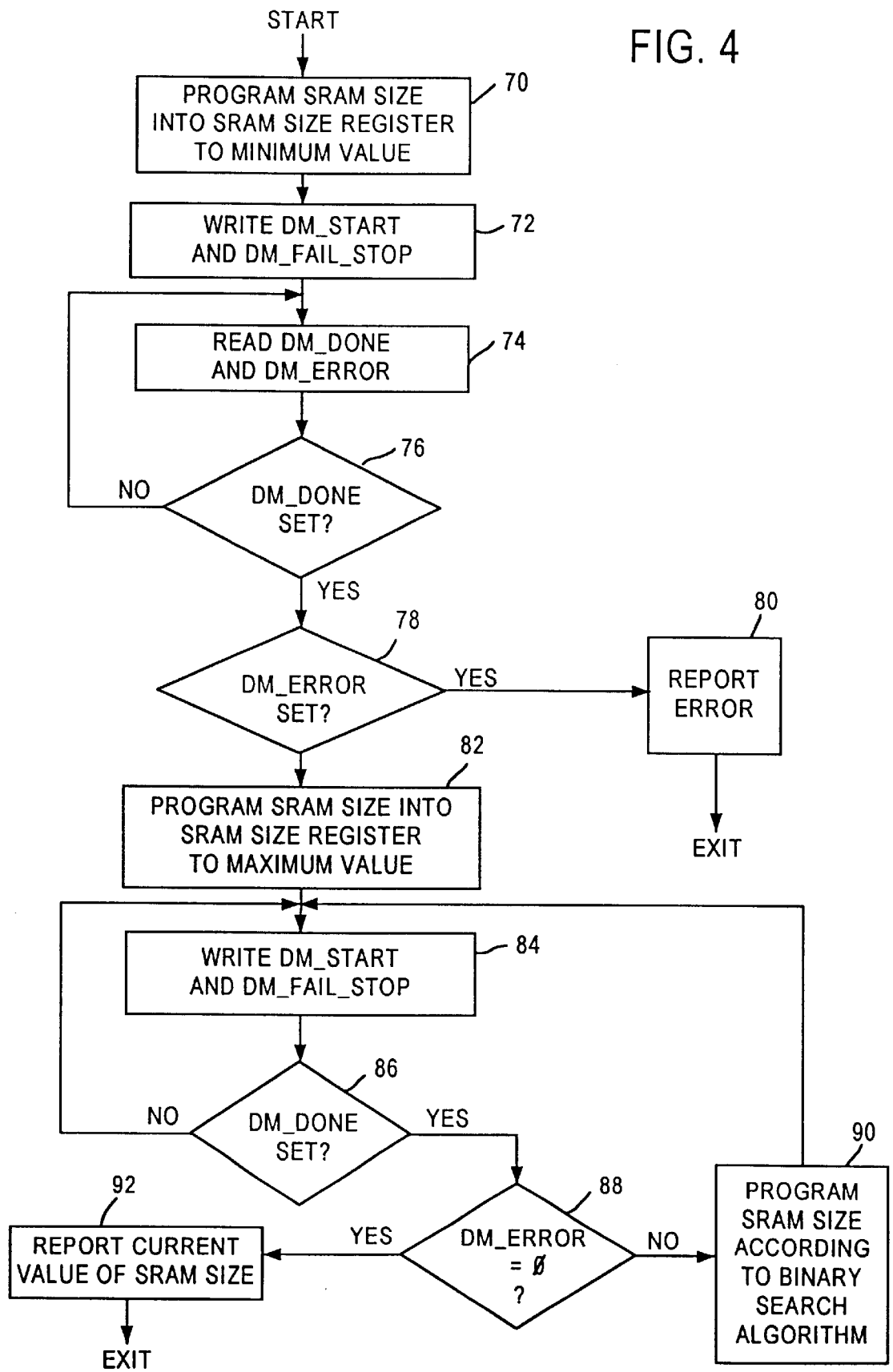

METHOD AND APPARATUS FOR EXERCISING EXTERNAL MEMORY WITH A MEMORY BUILT-IN TEST

RELATED APPLICATIONS

This application contains subject matter related to the subject matter disclosed in U.S. Provisional application Ser. No. 60/171,491, filed on Dec. 22, 1999 now abandoned.

FIELD OF THE INVENTION

The present invention relates to the field of network communications, and more particularly, to the testing of an external system memory of a network interface controller.

BACKGROUND OF THE INVENTION

Network interface controllers handle the transmission and reception of frame data between a transmitting network station and a receiving network station via a network communications system, such as a local area network. For transmission, frame data is sent from an upper layer down through a driver layer, a media access controller layer and then to a physical layer. In the transmitting network station, a central processor unit writes frame data and associated descriptors into system memory where a network interface controller reads the frame data and transmits the frame data onto the network. At the receiving network station a network interface controller stores the frame data into memory.

Clock speed and data transfer rates differ between the network and system sides of the network interface controller. Therefore, it is necessary to incorporate some quantity of data storage within the network interface controller. In some applications, it is advantageous for the network interface controller to incorporate a large amount of storage. The desired memory size may exceed that which can practically be integrated in a single-chip design, requiring external memory and an associated interface. This external memory, along with the PC board traces and connections, as well as parts of the logic within the network controller, comprise a memory subsystem. Failures in the memory subsystem may result from electrical or mechanical failure of any of the elements of the system and/or errors in the design of the PC board such as excessive loading or trace length.

Traditionally, register based read/write tests have been employed to test memory subsystems. However, register based read/write tests do not sufficiently test a memory subsystem. This is because the subsystem is not tested as a unit at normal operating speed to verify its correct operation. Furthermore, the register access logic provides a complication to the testing of the memory interface within the controller.

Additionally, it is desirable to determine the size of the memory through diagnostic software in order to allow different size memories to be connected to the network interface controller.

SUMMARY OF THE INVENTION

There is a need for a method and apparatus for testing the external memory of a network controller at normal operating speed in order verify correct operation.

These and other needs are met by embodiments of the present invention which provide a network interface controller coupled to an external memory. The controller comprises an external memory interface that interfaces the external memory to the network interface controller. The controller also includes memory built-in self-test (MBIST) logic configured to test an external memory coupled to the external memory interface, at a normal operating speed of the external memory.

The provision of MBIST logic in the network interface controller used to test the external memory at its normal operating speed allows the external memory to be checked sufficiently to verify correct operation. This overcomes the imitations of conventional register based read/write tests that do not sufficiently test the memory subsystem. Furthermore, the register access logic of the network interface controller is not used as part of the memory interface within the controller during the MBIST.

When the network interface controller is provided with a memory size register, in accordance with certain embodiments of the invention, running the MBIST test with different sizes allows the actual size of the memory to be determined in an elegant manner.

The earlier stated techniques are also met by another embodiment of the present invention which provides a method of testing the memory subsystem of a network interface coupled to an external memory. The method comprises the steps of setting a memory size register with a memory size value, performing a memory built-in self-test (MBIST), re-setting the memory size register with a different memory size value, re-performing the MBIST, and repeating the steps of re-setting the memory size register and re-performing the MBIST until the external memory size is determined.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 4 is a flow chart of an exemplary method of performing an MBIST in accordance with an embodiment of the present invention.

DETAILED DESCRIPTION OF THE INVENTION

The present invention addresses the problem of verifying the correct operation of an external memory coupled to a network interface controller. The present invention addresses this concern by, in certain embodiments, employing a memory built-in self-test logic that is configured to test the external memory at a normal operating speed of the external memory. Also, in accordance with certain embodiments, the external memory size is determined during the MBIST. This facilitates the use of differently sized external memories with the network interface controller.

Figure 1:
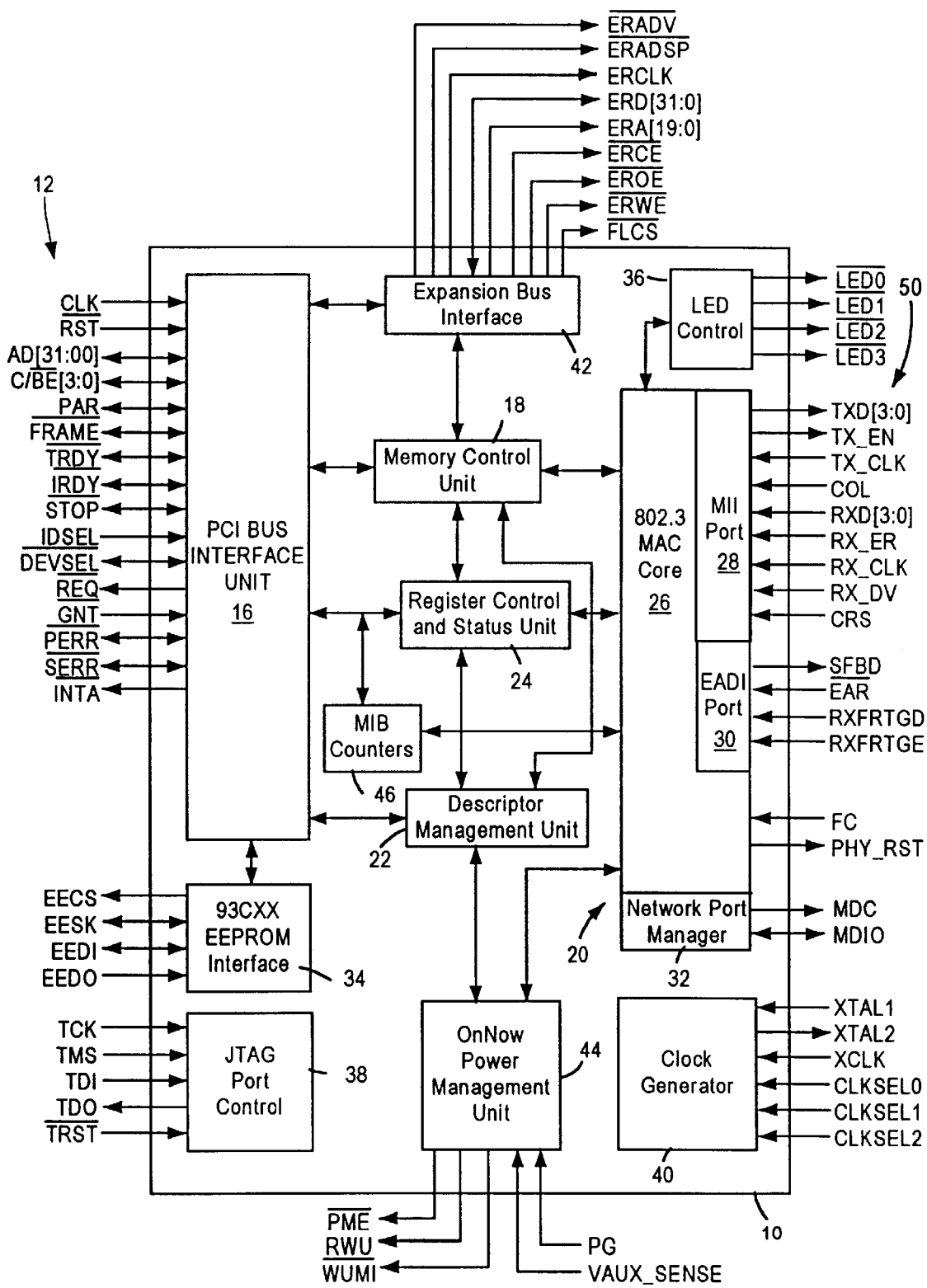
FIG. 1 is a block diagram of a network interface controller constructed in accordance with an embodiment of the present invention, with a network interface controller being coupled to a CPU and an external memory.

FIG. 1 is a block diagram of an exemplary embodiment of a network interface controller constructed in accordance with an embodiment of the present invention. The network interface controller is described in the context of a IEEE 802.3 compliant network interface configured for sending and receiving data packets between a system memory and a network medium using established media access control (MAC) and physical layer (PHY) protocols.

The network interface 10, preferably a single-chip, 32-bit Ethernet controller, provides an interface between a local bus 12 of a computer, for example, a peripheral component interconnect (PCI) local bus, and an Ethernet-based media 50. The reference numeral 50 identifies either an actual network medium, or alternately a signal path (e.g., a media independent interface (MII) to a physical layer transceiver coupled to the network media.

The network interface 10 includes PCI bus interface unit 16, and memory control unit 18, a network interface portion 20, a descriptor management unit 22 and register control and status unit 24. The network interface portion 20 includes an IEEE 802.3 compliant and full-duplex capable media access control (MAC) core 26, a media independent interface (MII) port 28 for connecting external 10 megabit per second, 100 megabit per second, or 1000 megabit per second transceivers, an external address detection interface (EADI) port 30, and a network port manager unit 32. The network interface 10 also includes an EEPROM interface 34 for reading from and writing to an external EEPROM, on LED control 36, and IEEE 1149.1-compliant JTAG boundary scan test access port interface 38, a clock generation unit 40, and an expansion bus 42. The expansion bus interface unit 42 interfaces to an external data memory 60 for frame data storage, control data storage and status data storage. The expansion interface unit 42 also interfaces to non-volatile (e.g., EEPROM or Flash memory) storage for boot ROM used during start-up.

The PCI bus interface unit 16, compliant with the PCI local bus specification (revision 2.2), receives data frames from a host computer memory via PCI bus 12. The PCI bus interface unit 16, under the control of the descriptor management unit 22, receives transfers from the host computer via the PCI bus 12. For example, transmit data received from the PCI bus interface unit 16 is passed to the memory control unit 18 which stores it in the data memory. Subsequently, the memory control unit 18 retrieves the transmit data from the data memory and passes it to the MAC 26 for eventual transmission to the network. Similarly, received data from the network 50 is processed by the MAC 26 and passed to the memory control unit 18 for storage in the data memory 60. Subsequently, the memory control unit 18 receives the data from the data memory 16 passes it to the PCI bus interface unit 16 for a transfer to the host computer 62 via the PCI bus 12.

The descriptor management unit 22 manages the transfers of data to and from the host computer 62 via the PCI bus interface unit 16. Data structure contained the memory of the host computer 62 specified the size and location of the data buffers along with various control in status information. The descriptor management unit 22 interfaces with the memory control unit 18 to insert control information into the transmitted data stream and to retrieve status information from the received data stream. The network interface portion 20 includes the network port manager 32 that perform auto-negotiation functions my communicating via the media 50 with a corresponding auto-negotiation unit in the link partner (e.g., the centralized hub, repeater, work station, or switch).

The network interface 10 also includes a power management unit 44 that enables remote activation (i.e., turn-on) of the host computer 62 via the network medium 50 by detecting a predetermined pattern on the medium 50 according to Microsoft On Now and ACPI specifications, including compliance with Magic Packet technology and PCI bus power management interface specification protocols.

The network interface 10 also includes a MIB counter unit 46 which excepts information from the MAC 26 regarding frame transmission and reception and maintains the statistics necessary for network management. The statistics are accessed by the host computer 62 via the PCI bus interface unit 16.

Figure 2:
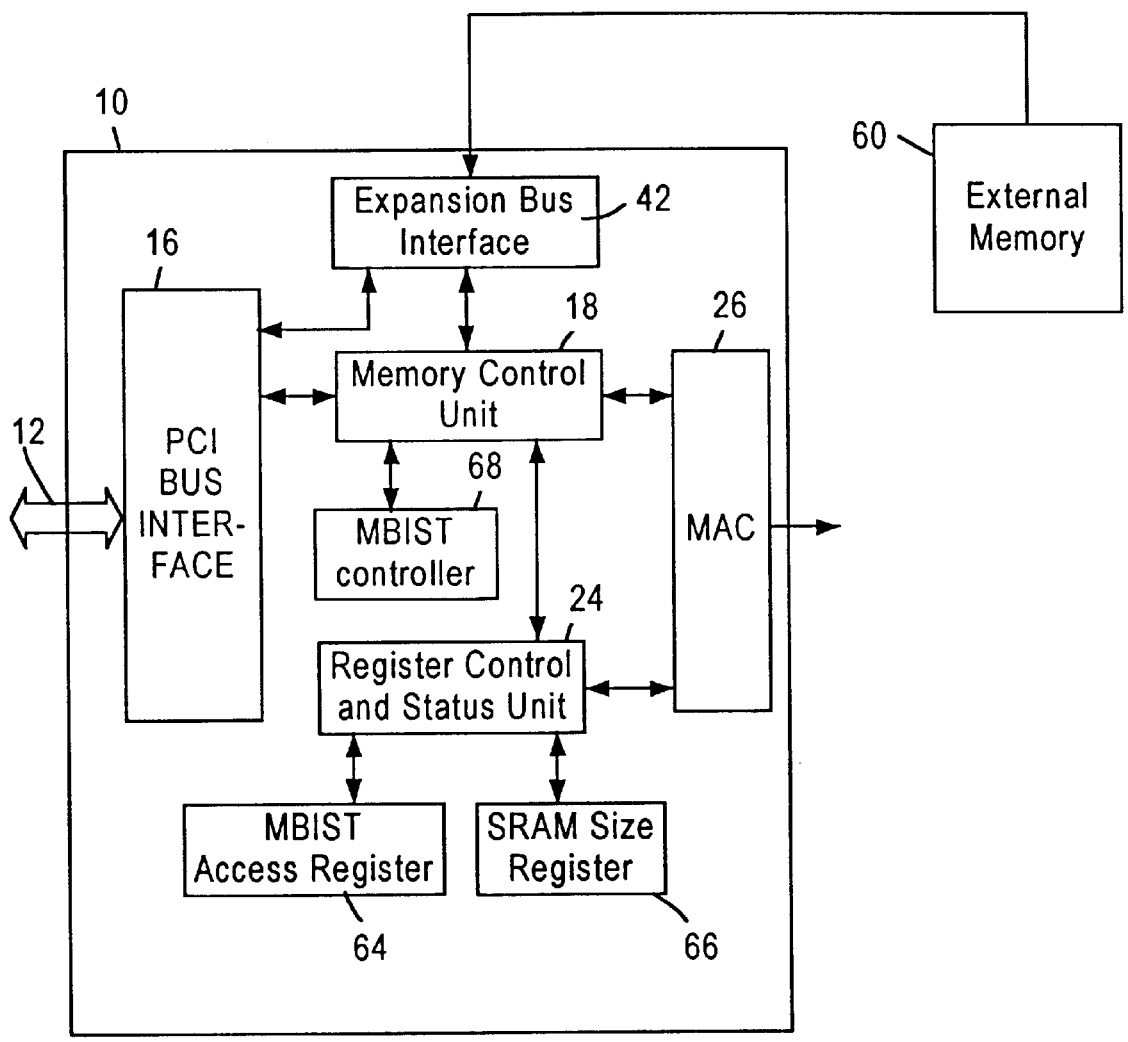
FIG. 2 is a block diagram depicting in block diagram form certain elements of the network interface controller and the external memory in order to highlight certain features of the invention.

FIG. 2 depicts the network interface controller and external memory 60. Only certain elements of the network interface controller 10 are depicted for purposes of the following description.

The network interface controller 10 uses the external memory 60 for receive and transmit frame data. The size of the memory can be up to 4 Megabytes, in preferred embodiments, organized as 1 M×32 bits. The memory size is larger in other embodiments of the invention. The size of the memory 60 is indicated by the contents of an external memory size register 66. The external memory size is loaded into the external memory size register 66 from an EEPROM interface 34.

The external memory 60 is programmed in units of 512-byte pages. To specify how much of the external memory 60 is allocated to transmit and how much is allocated to receive, a user should program a boundary register (not depicted) with the page boundary where the receive buffer begins. The boundary register is also programmed in units of 512-byte pages. The transmit buffer space starts at the first address in the boundary register. It is up to the user or a software driver to split up the memory for a transmit or receive, and there is no defaulted value in preferred embodiments. The minimum memory size required in preferred embodiments is for 512-byte pages for each transmit and receive queue which limits the memory size to be at least 4 Kbytes.

The network interface controller 10 does not allow software diagnostic access to the external memory 60. However, the network interface controller 10 provides software access to an internal memory built-in self-test (MBIST) controller (i.e. control logic) 68 which runs extensive at-speed tests on the external memory 60, the internal access logic 18 for the memory 60, and PC board interconnect.

The expansion bus interface 42 (external memory interface) includes external memory address pins [19:0] that provide addresses for both the external memory 60 and an external boot ROM device. All of these outputs [19:0] are forced to a constant level to conserve power while no access on the external memory bus is being performed. The ERD [31:0] pins provide data bits [31:0] for external memory 60 accesses. These signals are forced to a constant level to conserve power while no access on the external memory bus is being performed. For boot ROM accesses, the ERD [7:0] pins provide the data bits [7:0] for boot ROM accesses.

$\overline{\text{ERCE}}$ serves as the chip enable signal for the external memory 60. This is asserted low when the external memory address on the ERA [19:0] pins is valid.

$\overline{\text{FLCS}}$ serves as the chip select for the boot device. It is asserted low when the boot ROM address and ERA [19:0] pins is valid.

$\overline{\text{EROE}}$ is the external memory output enable signal that is asserted active low during external memory device read operations to allow the external memory 60 to drive the ERD [31:0] data bus. It is de-asserted at all other times.

$\overline{\text{ERWE}}$ is the external memory byte enable that provides the write enable for write accesses to the external memory 60 in the Flash (boot ROM) device.

ERADSP is the external memory address strobe signal that provides the address strobe signal to load the address into the external memory 60.

ERADV uses the external memory address advance that provides the address advance signal to the external memory 60. This signal is asserted low during a burst access to increment the address counter in the external memory 60.

ERCLK is the reference clock for all synchronous memory accesses.

Referring to FIG. 2, the network interface controller 10 of the present invention employs control logic 68 which controls the MBIST procedure to determine the size of the external memory 60 and verify its correct operation. The control logic 68 may be part of the memory controller 18 or logically separate from this controller. The control logic 68 employs the MBIST procedure to exercise the memory subsystem. The memory subsystem includes the external memory 60, the input/output logic (the expansion bus interface 42), and the board traces in the external memory 60. This test can run at normal memory operating speed and test normal and/or worst-case access patterns.

The MBIST is a pattern generation test that comprises writing data to the external memory 60 and reading this data from the external memory 60 and comparing it with expected data. Typically, such a MBIST is found in tightly coupled MBIST logic that tests for fabrication errors. The term "tightly coupled" is meant to indicate that the logic is located physically within the RAM block and has access to internal RAM signals that are not usually accessible via pins on the edges of a RAM chip. By contrast, the present invention provides MBIST logic on the network interface controller 10, which connects to an external memory 60, and is thus not tightly coupled. This allows different sized external memories 60 to be used in accordance with the requirements of the user.

The controller logic 68 employs the MBIST register 64 and an SRAM size register 66 to perform the size determination and verify the operation of the external memory 60. These registers may form part of the register control and status unit 24. A schematic depiction of the MBIST register 64 is provided in FIG. 3. The MBIST register 64, in preferred embodiments, is a 64 bit register. A description of the bit fields in the register now follows.

Bit 63 is the DM_DONE bit which indicates whether the MBIST is done. This bit is set to 1 when the automatic memory test has stopped, either because the test has completed or because an error was detected. It is cleared to 0 when either a DM_START or DM_RESUME is set. The DM_DONE bit is read-only.

Bit 62 is the DM_ERROR bit, which acts as the MBIST error indicator. This bit is set to 1 when the memory test logic has detected a memory error. It is cleared to 0 when either DM_START or DM_RESUME is set. This bit is also read-only.

DM_START is the MBIST start bit. Setting this bit to 1 resets the MBIST logic, including the DM_ERROR and DM_TEST_FAIL bits, and starts the memory test process. DM_START should not be set at the same time that the DM_RESUME bit is set. When the memory test stops, the DM_START bit is automatically cleared. This bit is read/write.

DM_RESUME bit is bit 60 and acts to resume the MBIST. Setting this bit to 1 restarts the memory test sequence at the point where it last stopped. Setting this bit clears the DM_ERROR bit, but it does not clear the DM_TEST_FAIL bit. This bit should not be set at the same time that the DM_START bit is set. The DM_RESUME bit is automatically cleared when the memory test stops. This bit is read/write.

The DM_FAIL_STOP bit is bit 59 and performs the MBIST stop on failure control. When this bit is set to 1, the memory test will stop each time an error is detected. When this bit is cleared to 0, the memory test will run to completion, regardless of the number of errors that are detected. This bit is read/write.

Bit number 58 is the DM_TEST_FAIL bit that acts as the MBIST test failure indicator. This bit is set when a memory test error is detected. It is reset when DM_START is set to 1. It is not cleared when DM_RESUME is set to 1. This bit is read only.

Bit number 57 is reserved, and written as 0, read as undefined.

DM_DIR bit (bit 56) is the MBIST test direction. This bit is set to 1 when the MBIST memory pointer was counting down when the test stopped. It is cleared to zero when the MBIST memory pointer was counting up when the test stopped. This bit is read only.

Bit 55–54 represent the DM_FAIL_STATE bits and acts as the MBIST error offset indicator. This field indicates offset of the location of the last memory test error with respect to the value of the DM_ADDR field. Interpretation of this field depends on the value of the DM_DIR field which indicates whether the address pointer was counting up or down when the error was detected. This field is read only. An exemplary assignment of the error location as a function of the DM_DIR bit and the DM_FAIL_STATE bits is provided below.

| DM_DIR | FAIL_STATE | Error Location |
|--------|------------|----------------|
| 0 | 00 | Error at DM_ADDRESS |
| 0 | 01 | Error at DM_ADDRESS − 1 |
| 0 | 10 | Error at DM_ADDRESS − 2 |
| 0 | 11 | Error at DM_ADDRESS − 3 |
| 1 | 00 | Error at DM_ADDRESS |
| 1 | 01 | Error at DM_ADDRESS + 1 |
| 1 | 10 | Error at DM_ADDRESS + 2 |
| 1 | 11 | Error at DM_ADDRESS + 3 |

The DM_BACKG bits 53–52 form the MBIST background bits. This field contains the background pattern that the memory test logic was using when the test stopped. This field is read-only.

Bits 51–32 are the DM_ADDR bits and form the MBIST address. This field contains the contents of the MBIST address pointer at the time of the test stop. Because of the pipelined nature of the external memory 60, this value may not be the location of the memory error. The actual error location is obtained by adding or subtracting the contents of the DM_FAIL_STATE field as described above. This field is read-only.

The DM_DATA bits are bits 31–0. This field contains the last data that the memory test logic read from the external memory 60. If the DM_ERR and DM_FAIL_STOP bits are both set to 1, the contents of this field contains an error. This field is read only.

Figure 3:
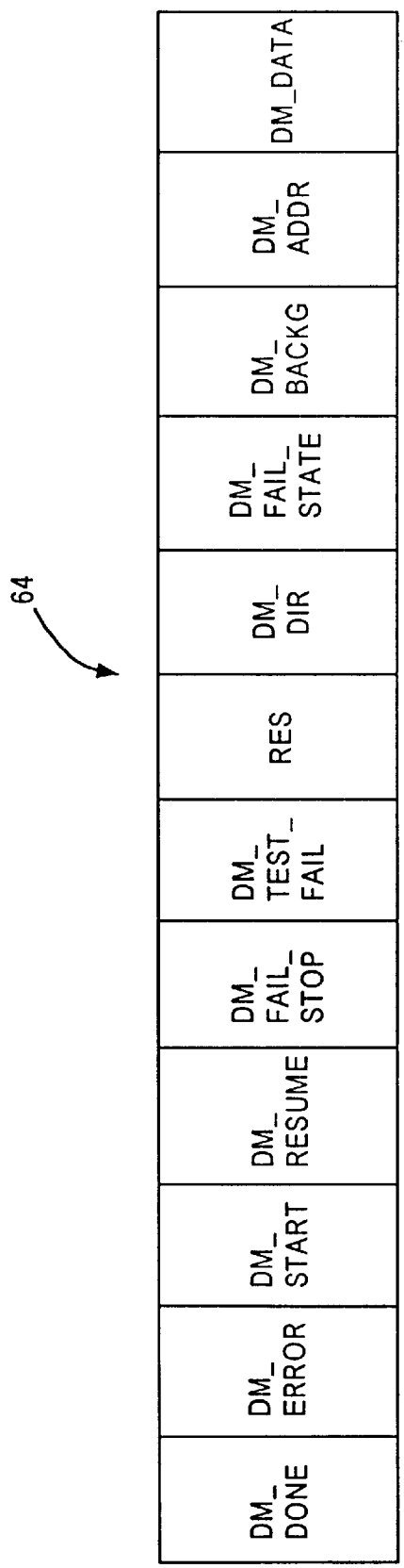
FIG. 3 is a schematic depiction of an MBIST register in accordance with an embodiment of the present invention.

Although the specific assignment bits in the MBIST register are provided in FIG. 3 and the above description, this assignment of bits is exemplary only as the MBIST register 64 may be configured differently but otherwise consistent with the description of the present invention. The contents of the register are cleared to 0 when the reset pin is asserted.

FIG. 4 is a flow chart of an exemplary embodiment of the method of verifying the operation of the external memory 60 and its size, using the control logic 68 in accordance with embodiments of the present invention. After the network interface controller 10 is started, the external memory (SRAM) size is programmed into the SRAM_SIZE register 66 to a minimum allowed value of 4. After this step is completed, the procedure continues to step 72, in which the DM_START and DM_FAIL_STOP bits in the MBIST register 64 are written. For example, bits 63:56 are written with 0x28. The remainder of the MBIST register 64 ignores writes so that it may be written with arbitrary data or not written at all. This action automatically starts the memory test process by the control logic 68.

The control logic 68 reads the DM_DONE bit (bit 63) and the DM_ERROR bit (bit 62) until the DM_DONE bit 63 is set to 1. This is depicted in FIG. 4 as steps 74 and 76. Once the DM_DONE bit is set, as determined in step 76, it is then determined in step 78 whether the DM_ERROR bit is set. If the DM_ERROR bit is set, the external memory 60 is considered defective, the error is reported in step 80 and the memory test process is exited.

When the DM_DONE bit is set, as determined in step 76, but the DM_ERROR bit is not set as determined in step 78, then the SRAM_SIZE register 66 is reprogrammed to the maximum value 0x8000, as depicted in step 82. Steps 74 and 76 are then re-performed as steps 84 and 86. In other words, the DM_START and DM_FAIL_STOP bits are written in the MBIST register 64 by the control logic 68. The memory test is then performed again until the DM_DONE bit is set, with the control logic 68 reading the DM_DONE and DM_ERROR bits. The process loops back to step 84 if the DM_DONE bit is not set as determined in step 86.

When the memory test is completed, indicated by the DM_DONE being set that is determined in step 86, it is again determined whether the DM_ERROR bit is set. If the DM_ERROR is 0, the current value in the SRAM_SIZE register 66 is reported out to the CPU 62 as the size of the external memory (step 92). The process is then exited. If the DM_ERROR bit is not set (i.e. not equal 0), the SRAM_SIZE register 66 is programmed to ½ the maximum (0x4000) and steps 84–86 are repeated. This process of reprogramming the SRAM_SIZE and performing the memory test until the DM_ERROR bit is 0, is repeated using the binary search algorithm until the size of the external memory 60 is determined.

The present invention as described above provides a built-in self-test for an external memory of an interface controller that verifies the correct operation of the external memory at operating speed. It also verifies the input/output logic of the network interface controller 10 and the PC board traces. It does this in a robust manner without the use of simple register read/writes. Also, the present invention provides an elegant manner to determine the size of the external memory, providing an automatic means of supplying the CPU with the size of the external memory.

Although the present invention has been described and illustrated in detailed, it is to be clearly understood that the same is by way of illustration and example only and is not to be taken by way limitation, the scope of the present invention being limited only by terms of the appended claims.

What is claimed is:

1. A network interface controller coupled to an external memory, the controller comprising:
    an external memory interface that interfaces the external memory to the network interface controller;
    an external memory size register that stores a value representing a size of the external memory;
    an MBIST access register including a start field and a fail-stop field; and
    memory built-in self-test (MBIST) logic configured to test an external memory coupled to the external memory interface at normal operating speed of the external memory, wherein
        the configuration of the MBIST logic to test the external memory includes logic to write the external memory size register with different values, and the start field and the fail-stop field with specified values.

2. The controller of claim 1, wherein the MBIST access register further includes a done field and an error field.

3. The controller of claim 2, wherein the configuration of the MBIST logic to test the external memory further includes logic to initially write the external memory register with a minimum allowed value, the start and fail-stop fields with set values, and read the done field and the error field until the value in the done field is a set value.

4. The controller of claim 3, wherein the configuration of the MBIST logic to test the external memory further includes logic to determine, upon the done field reaching the set value, whether the value in the error field is a set value and reporting that the external memory is defective when the value in the error field is the set value.

5. The controller of claim 4, wherein the configuration of the MBIST logic to test the external memory further includes logic to write the external memory register with a maximum allowed value, the start and fail-stop fields with set values, and read the done field and the error field until the value in the done field is the set value.

6. The controller of claim 5, wherein the configuration of the MBIST logic to test the external memory further includes logic to determine, upon the done field reaching the set value, whether the value in the error field is a set value and reporting the value in the external memory register when the error field is not the set value, and when the error field is at the set value continuously repeating the steps of:
    a) reporting the external memory register with a new value according to a binary search algorithm;
    b) writing the start and stop-fail fields with set values;
    c) reading the done field and the error field until the done field is at the set value, and
    d) determining whether the value in the error field is at the set value; until the value in the error field is not the set value.

7. A method of testing a memory subsystem of a network interface coupled to an external memory, comprising the steps of:
    a) setting an external memory size register with a memory size value representing a size of the external memory;
    b) writing a start field and a fail stop filed of a MBIST access register with specified values;
    c) performing a memory built-in self-test (MBIST);
    d) re-setting the memory size register with a different memory size value;
    e) rewriting the start field and the fail stop filed of the MBIST access register with the specified values;
    f) re-performing the MBIST; and
    g) repeating the steps d) through f) until the external memory size is determined.

* * * * *